(12) United States Patent
Tanomura et al.

(10) Patent No.: US 7,688,134 B2
(45) Date of Patent: Mar. 30, 2010

(54) TRANSIMPEDANCE AMPLIFIER

(75) Inventors: Masahiro Tanomura, Tokyo (JP); Kouji Matsunaga, Tokyo (JP)

(73) Assignee: NEC Corporation, Tokyo (JP)

( * ) Notice: Subject to any disclaimer, the term of this patent is extended or adjusted under 35 U.S.C. 154(b) by 53 days.

(21) Appl. No.: 11/990,871

(22) PCT Filed: Jul. 24, 2006

(86) PCT No.: PCT/JP2006/314554

§ 371 (c)(1),
(2), (4) Date: Apr. 21, 2008

(87) PCT Pub. No.: WO2007/023629

PCT Pub. Date: Mar. 1, 2007

(65) Prior Publication Data

US 2009/0102563 A1    Apr. 23, 2009

(30) Foreign Application Priority Data

Aug. 23, 2005    (JP) .............................. 2005-241498

(51) Int. Cl.
*H03F 1/34* (2006.01)
(52) U.S. Cl. ..................................................... 330/109
(58) Field of Classification Search ................ 330/107, 330/109, 110, 97
See application file for complete search history.

(56) References Cited

U.S. PATENT DOCUMENTS

| 3,673,512 | A | * | 6/1972 | Walters ....................... 330/97 |
| 4,291,223 | A | | 9/1981 | Sakane et al. |
| 4,636,053 | A | | 1/1987 | Sakane et al. |

FOREIGN PATENT DOCUMENTS

| JP | 55-018123 A | 2/1980 |
| JP | 62-025503 A | 2/1987 |
| JP | 2000-315922 A | 11/2000 |

* cited by examiner

*Primary Examiner*—Steven J Mottola
(74) *Attorney, Agent, or Firm*—Foley & Lardner LLP

(57) ABSTRACT

The present invention solves characteristic deterioration caused by peaking and a ground inductance, and provides a transimpedance amplifier capable of achieving a higher gain and a wider band. For this purpose, the transimpedance amplifier is configured to include a feedback circuit having two or more extreme frequencies and having a filter characteristic which is flat with respect to frequencies in a frequency region not more than a smallest extreme frequency among the extreme frequencies, which is flat with respect to frequencies in a frequency region not less than a largest extreme frequency among the extreme frequencies, and which has at least one negative inclination portion with respect to frequencies in a frequency region between the smallest and largest extreme frequencies.

8 Claims, 7 Drawing Sheets

FIG.16  REFERENCE CASE

TRANSIMPEDANCE AMPLIFIER

This application is the National Phase of PCT/JP2006/314554, filed Jul. 24, 2006, which claims priority to Japanese Application No. 2005-241498, filed Aug. 23, 2005, the disclosures of which are hereby incorporated by reference in their entirety.

TECHNICAL FIELD

The present invention relates to a transimpedance amplifier including a feedback circuit formed of resistance and capacitance, and more specifically, relates to a high gain, wide band transimpedance amplifier in which peaking is suppressed.

BACKGROUND ART

Accompanying an increasing trend toward blue laser DVD drives, a high gain and a wide band are demanded as characteristics of a transimpedance amplifier that forms a light-receiving amplifier circuit.

Figure 10:
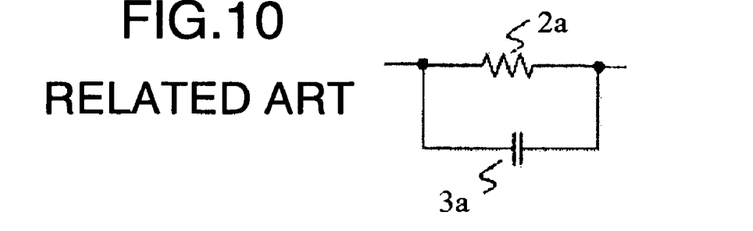
FIG. 10 is a diagram showing a feedback circuit of a conventional transimpedance amplifier.

In a transimpedance amplifier shown in FIG. 10, which uses a parallel connection circuit formed of a resistance and a capacitance as a feedback circuit unit, a extreme frequency can be indicated by $1/(2\pi \times \text{resistance} \times \text{capacitance})$.

In order to broaden a band of the transimpedance amplifier, the resistance or the capacitance that forms the parallel connection circuit, for example, should be reduced.

Figure 11:
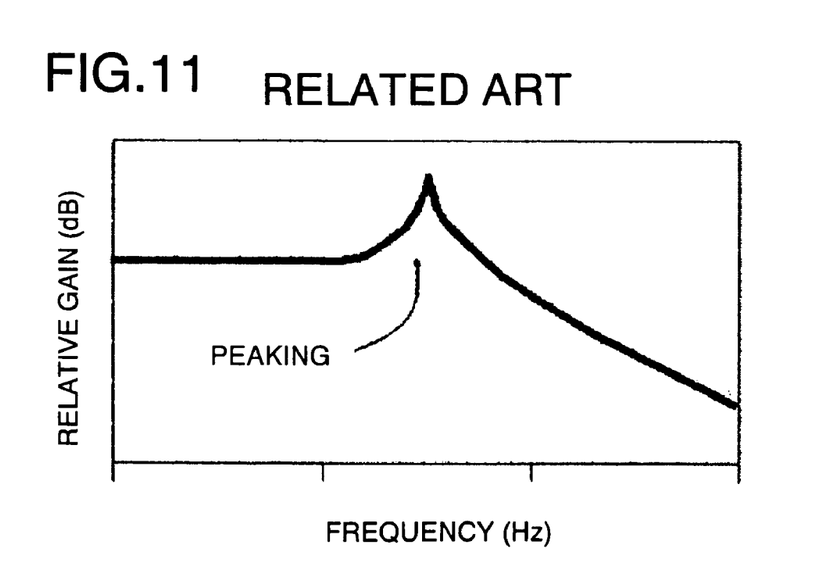
FIG. 11 is a graph showing a peaking characteristic of the conventional transimpedance amplifier.

However, when the resistance is reduced, a gain of the transimpedance amplifier is reduced, which is not desirable. Thus, the capacitance should be reduced. However, another problem of peaking shown in FIG. 11, in which the gain abruptly increases with respect to a frequency, may arise. When such peaking occurs, although the band may be broadened on one hand, a group delay deteriorates in a region of the frequency at which the peaking has occurred. Thus, it is not desirable to reduce the capacitance.

Figure 12:
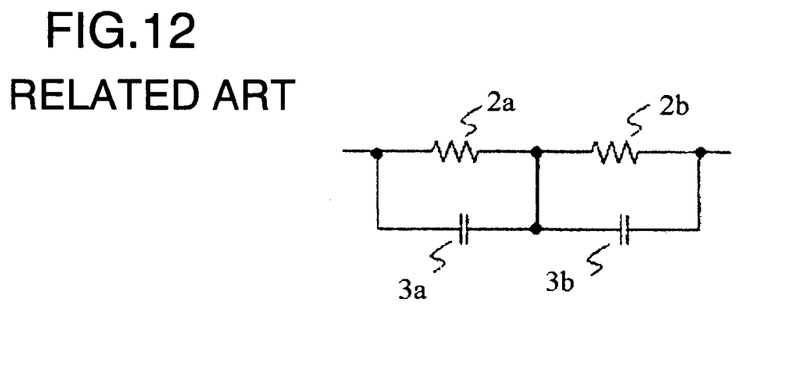
FIG. 12 is a diagram showing a feedback circuit of a conventional transimpedance amplifier.

As another means for broadening the band, a feedback circuit shown in FIG. 12 is disclosed in Patent Document 1, for example. In this feedback circuit, a parallel connection circuit formed of a resistance and a capacitance is connected in series to a parallel connection circuit formed of a resistance and a capacitance. However, in the case of this configuration as well, a problem similar to that in the conventional art described before may arise.

Figure 13:
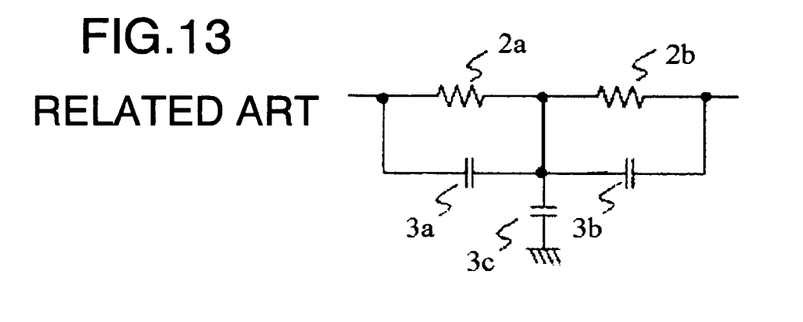
FIG. 13 is a diagram showing a feedback circuit of a conventional transimpedance amplifier.

Patent Document 1 further discloses a circuit shown in FIG. 13, at the same time. In this feedback circuit, a parallel connection circuit formed of a resistance and a capacitance and a parallel connection circuit formed of a resistance and a capacitance are connected in series, and between the ground and a connecting point between the parallel connection circuits, a capacitance is connected.

Patent Document 1:
JP Patent Kokai Publication No. JP-P-2000-315922A

DISCLOSURE OF THE INVENTION

Problems to be Solved by the Invention

However, when the feedback circuit shown in FIG. 13 is actually applied to a transimpedance amplifier, a parasitic ground inductance caused by bonding and a contact hole is added, in series to the capacitance connected between the ground and the connecting point between the parallel connection circuits. Desired characteristics are therefore difficult to obtain.

The present invention solves characteristic deterioration caused by peaking and a ground impedance which are problems of the conventional arts as described above. It is therefore an object of the present invention to provide a transimpedance amplifier capable of achieving a higher gain and a wider band.

Means to Solve the Problems

In order to solve the problems described above, a transimpedance amplifier is configured to include a feedback circuit having two or more extreme frequencies, the feed back circuit having a filter characteristic which is flat with respect to frequencies in a frequency region not more than a smallest extreme frequency among the extreme frequencies, is flat with respect to frequencies in a frequency region not less than a largest extreme frequency among the extreme frequencies, and has at least one negative inclination portion with respect to frequencies in a frequency region between the smallest and largest extreme frequencies.

Further, it is preferable that the largest extreme frequency of the feedback circuit be identical to a peaking frequency.

Further, it is preferable that the extreme frequencies of the feedback circuit be identical to the peaking frequencies, respectively.

The feedback circuit is configured to be a feedback circuit having two terminals, the feedback circuit being formed of a plurality of resistances and at least one capacitance, the resistances being connected in parallel between the two terminals, the resistances being divided into two or more resistance groups, and the at least one capacitance being connected between respective dividing points of the resistances.

A part of resistance of the divided resistances may be removed.

A part of resistance of the divided resistances may be short-circuited.

A part of resistance of the divided resistances may be removed, and a part of resistance of the divided resistances may be short-circuited.

MERITORIOUS EFFECTS OF THE INVENTION

An effect of the present invention will be described below.

Figure 14:
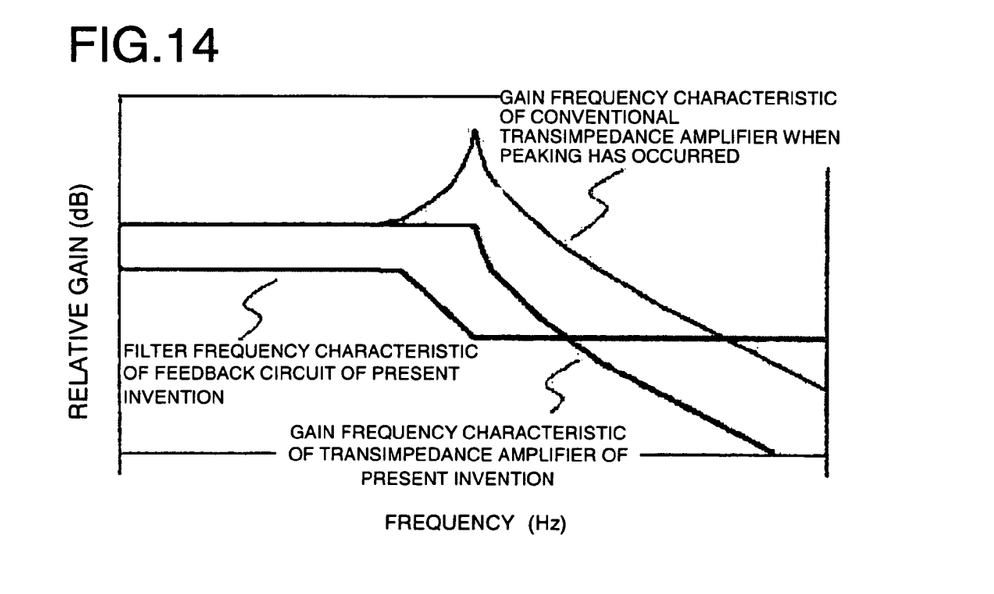
FIG. 14 is a graph showing frequency characteristics of a feedback circuit and the transimpedance amplifier according to the present invention.

According to the present invention, a constant amount of a gain of the transimpedance amplifier in a region of frequencies higher than a frequency at which peaking occurs can be filtered, regardless of the frequencies, as shown in FIG. 14.

Accordingly, peaking can be suppressed, without remarkably reducing the gain at the frequencies higher than the frequency at which the peaking has occurred. In addition, a wider band can be achieved.

The reason for obtaining the above effect will be described using drawings.

Figure 15:
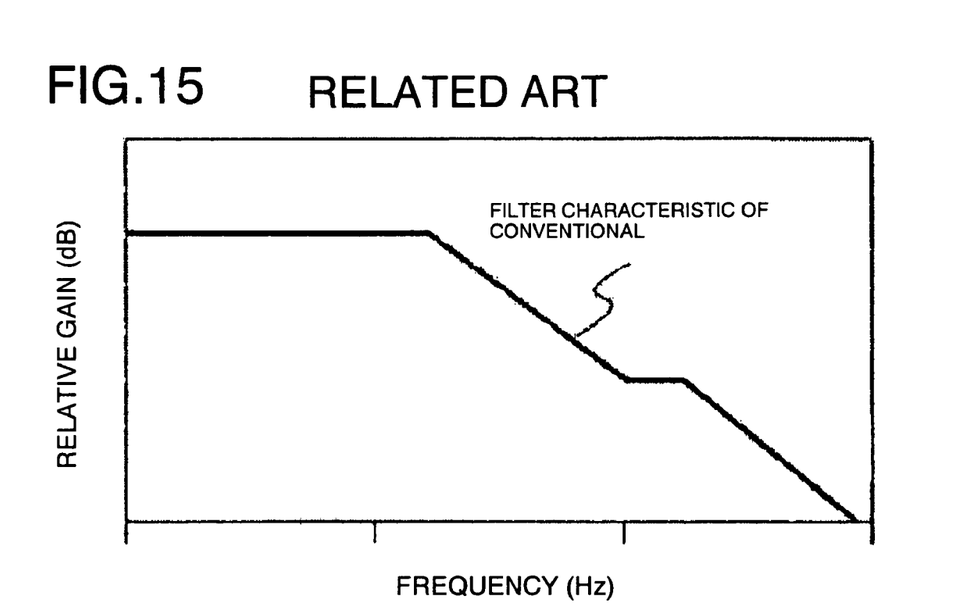
FIG. 15 is a graph showing a frequency characteristic of a conventional feedback circuit.

A filter characteristic of the feedback circuit of Patent Document 1 (JP Patent Kokai Publication No. JP-P-2000-315922A), which is a conventional art, is shown in FIG. 15. In the present invention, the filter characteristic that decreases from the smallest extreme frequency and is flat at frequencies equal to or higher than the largest extreme frequency is obtained. On the other hand, in the case of the conventional art, the filter characteristic keeps on decreasing in a high frequency region equal to or higher than the largest extreme frequency.

Figure 16:
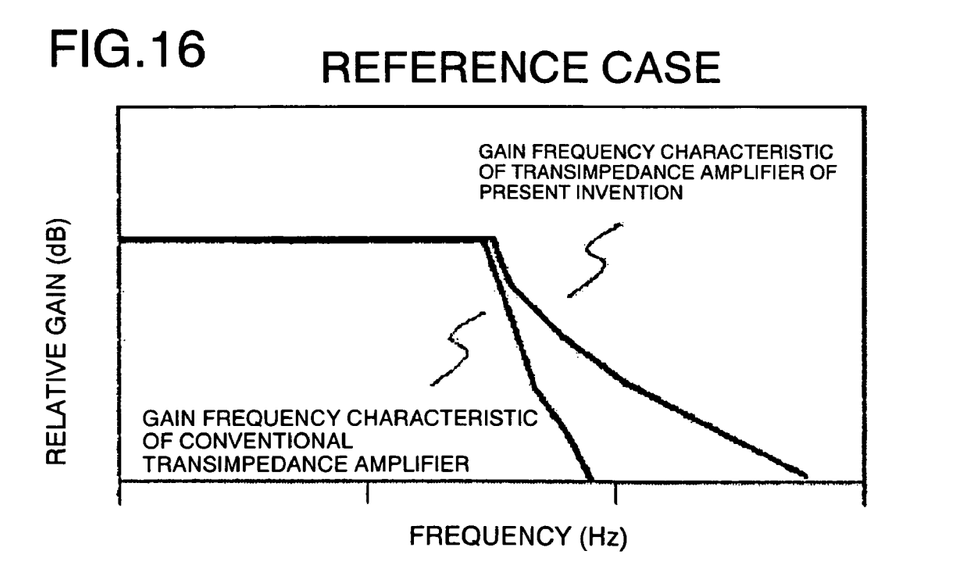
FIG. 16 is a graph comparing the frequency characteristic of a transimpedance amplifier of the present invention with a frequency characteristic of a conventional transimpedance amplifier.

FIG. 16 shows a case where the feedback circuits each having the filter characteristic described above are used in transimpedance amplifiers, respectively. In the present invention, the gain at frequencies equal to or higher than the largest extreme frequency increases becomes relatively higher due to the filter characteristic described before. A higher gain and a wider band thus can be achieved.

Further, according to the configuration described above, the feedback circuit is formed using the two terminals. Thus, the feedback circuit will not be influenced by a ground inductance.

EXPLANATIONS OF SYMBOLS

| 1a, 1b, 1ab, 1ac, 1ad 1ae, 1af | transimpedance amplifier |
|---|---|
| 2a, 2b, 2c, 2d, 2e, 2f, 2g, 2h, 2i | resistance |
| 3a, 3b, 3c | capacitance |
| 4a, 4b | amplifier |

PREFERRED MODES FOR CARRYING OUT THE INVENTION

In order to describe modes of the present invention in further detail, a description will be given with reference to drawings.

First Exemplary Embodiment

First, a transimpedance amplifier according to a first exemplary embodiment of the present invention will be described with reference to drawings.

Figure 1:
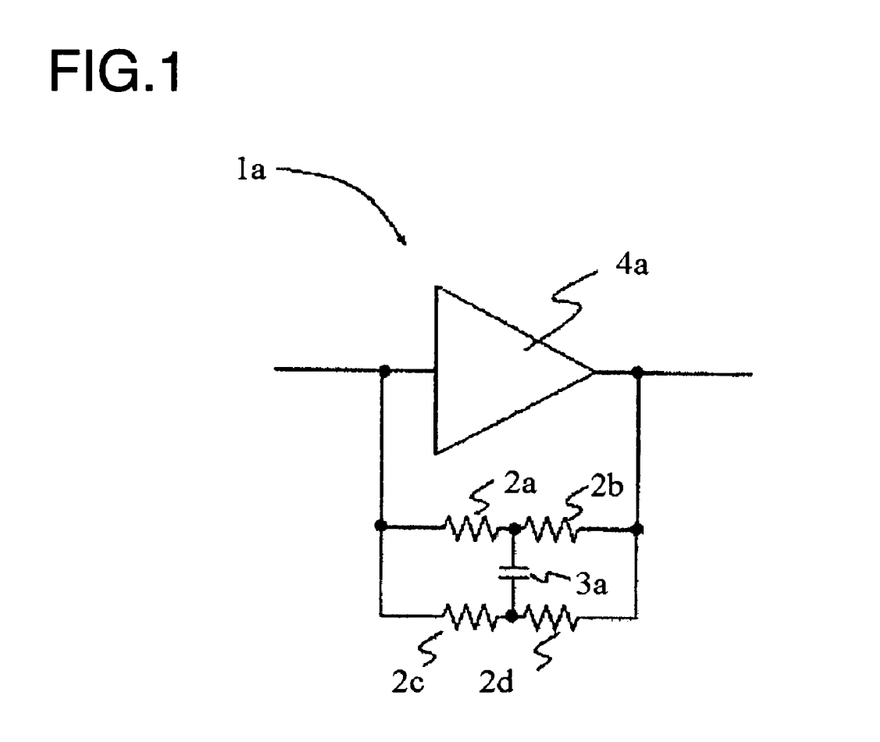
FIG. 1 is a diagram showing a configuration example of a transimpedance amplifier according to a first exemplary embodiment of the present invention.

FIG. 1 is a diagram showing a configuration example of the transimpedance amplifier according to the first exemplary embodiment.

That is, in a transimpedance amplifier $1a$ according to the first exemplary embodiment, an amplifier $4a$ and a feedback circuit formed of resistances $2a$, $2b$, $2c$, and $2d$, and a capacitance $3a$ are arranged. More specifically, the feedback circuit is a two-terminal feedback circuit formed of the four resistances ($2a$, $2b$, $2c$, and $2d$) and the one capacitance $3a$. In the feedback circuit, the resistances $2a$ and $2b$ are connected to the resistances $2c$ and $2d$ in parallel, the resistances connected in parallel are divided into two resistance groups, and the capacitance $3a$ is connected between modes (connecting points) at which the resistances are divided.

By this transimpedance amplifier $1a$, an effect is brought about in which peaking is suppressed and a wider band and a higher gain are obtained.

Figure 2:
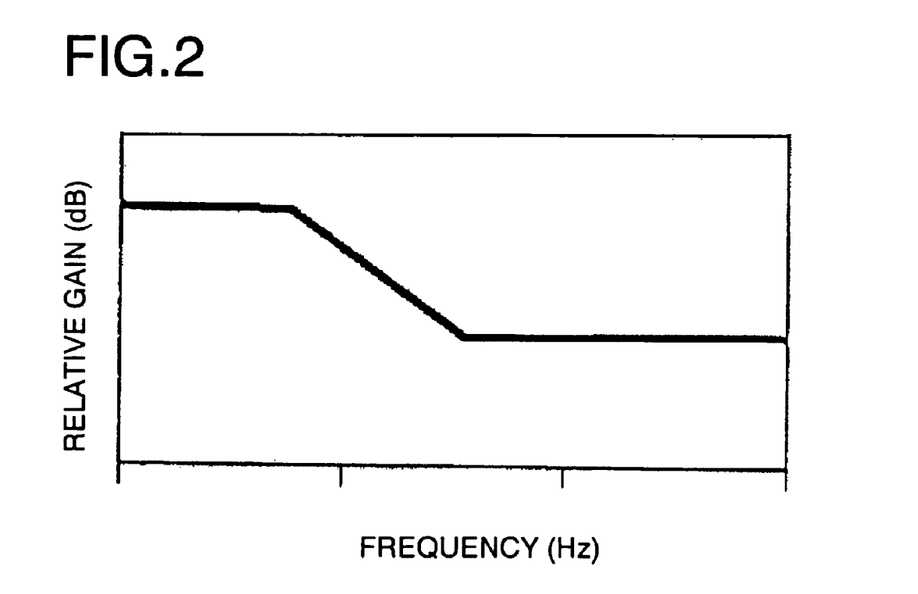
FIG. 2 is a graph showing a frequency characteristic of a feedback circuit according to the first exemplary embodiment of the present invention.

This is because the feedback circuit in the transimpedance amplifier $1a$ has two extreme frequencies shown in FIG. 2 and the feedback circuit has a filter characteristic which is flat with respect to frequencies in a frequency region not more than a lower one of the extreme frequencies, which is flat with respect to frequencies in a frequency region not less than a higher one of the extreme frequencies, and which has a negative inclination portion with respect to frequencies in a frequency region between the two extreme frequencies.

The effect of this exemplary embodiment will be further described, using expressions.

When resistance values of the resistance $2a$, the resistance $2b$, the resistance $2c$, and the resistance $2d$ in the feedback circuit in the transimpedance amplifier $1a$ according to the first exemplary embodiment are indicated by R1, R2, R3, and R4, respectively, and when a capacitance value of the capacitance $3a$ is indicated by C, a transfer impedance of the feedback circuit is given by the following expression (1), in which $\omega = 2\pi \times \text{frequency}$.

[Math 1]

$$R = \frac{(R_1 + R_2)(R_3 + R_4) + j\omega C \left\{ \begin{array}{c} R_1 R_3 (R_2 + R_4) + \\ R_2 R_4 (R_1 + R_3) \end{array} \right\}}{(R_1 + R_2 + R_3 + R_4) + j\omega C (R_1 + R_3)(R_2 + R_4)} \quad (1)$$

In a low frequency region, a transfer impedance is given by the following expression (2), and in a high frequency region, a transfer impedance is given by the following expression (3).

[Math 2]

$$R_{low} = \frac{(R_1 + R_2)(R_3 + R_4)}{R_1 + R_2 + R_3 + R_4} \quad (2)$$

-continued

[Math 3]
$$R_{high} = \frac{R_1 R_3 (R_2 + R_4) + R_2 R_4 (R_1 + R_3)}{(R_1 + R_3)(R_2 + R_4)} \quad (3)$$

Next, when resistance values of a resistance 2a, a resistance 2b, a capacitance 3a, a capacitance 3b, and a capacitance 3c in a feedback circuit shown in FIG. 13 are indicated by R1, R2, and C1, C2, and C3, respectively, a transfer impedance of the feedback circuit is given by the following expression (4).

[Math 4]
$$R = -\frac{1}{(A_1 + A_2) + j\omega C_3 A_1 A_2} \quad (4)$$

where,

[Math 5]
$$A_1 = \frac{R_1}{1 + j\omega C_1 R_1}$$
$$A_2 = \frac{R_2}{1 + j\omega C_2 R_2}$$

In the low frequency region, a transfer impedance of the feedback circuit is given by the following expression (5), and in the high frequency region, a transfer impedance of the feedback circuit is given by the following expression (6).

[Math 6]
$$R_{low} = R_1 + R_2 \quad (5)$$

[Math 7]
$$R_{high} = 0 \quad (6)$$

As apparent from the above expressions, when the conventional feedback circuit is applied to a transimpedance amplifier, the transfer impedance on a high frequency side becomes zero. Thus, a gain on the high frequency side is reduced. On the other hand, in the feedback circuit in the transimpedance amplifier 1a according to the first exemplary embodiment, the transfer impedance becomes constant with respect to frequencies on the high frequency side, as apparent from Expression (3). Thus, remarkable reduction of a gain on the high frequency side can be suppressed.

A desirable extreme frequency of the feedback circuit in this exemplary embodiment is a frequency that is identical to a peaking frequency.

Figure 3:
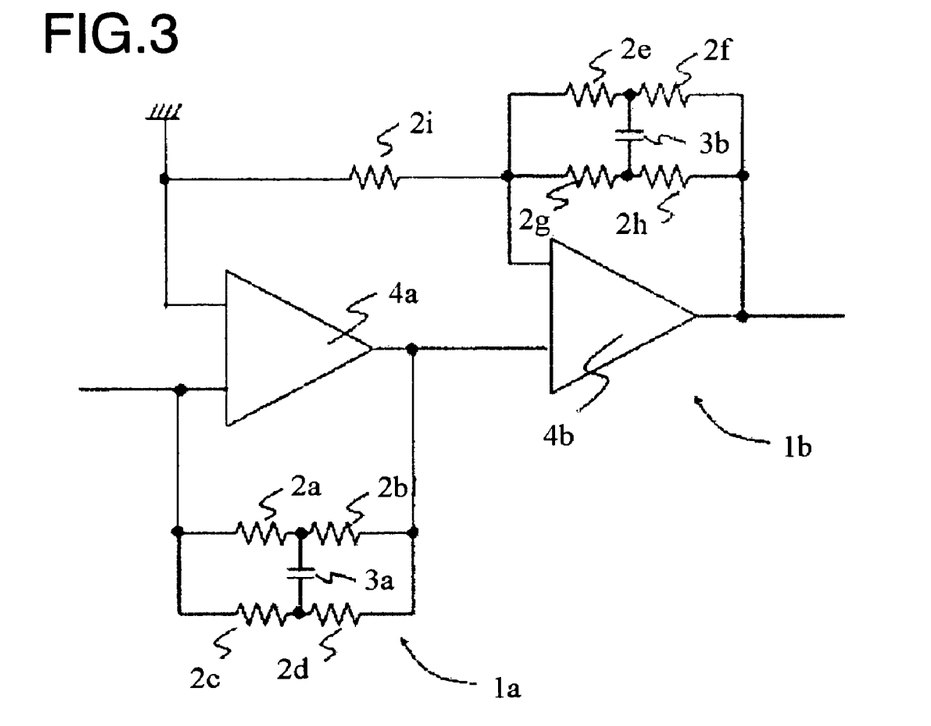
FIG. 3 is a diagram showing a configuration example of the transimpedance amplifier according to the first exemplary embodiment of the present invention.

Further, the transimpedance amplifier in this exemplary embodiment may be formed of a multi-stage configuration, using a plurality of amplifiers (amplifiers) 4a and 4b, as shown in FIG. 3.

Second Exemplary Embodiment

Next, a transimpedance amplifier according to a second exemplary embodiment of the present invention will be described with reference to drawings.

Figure 4:
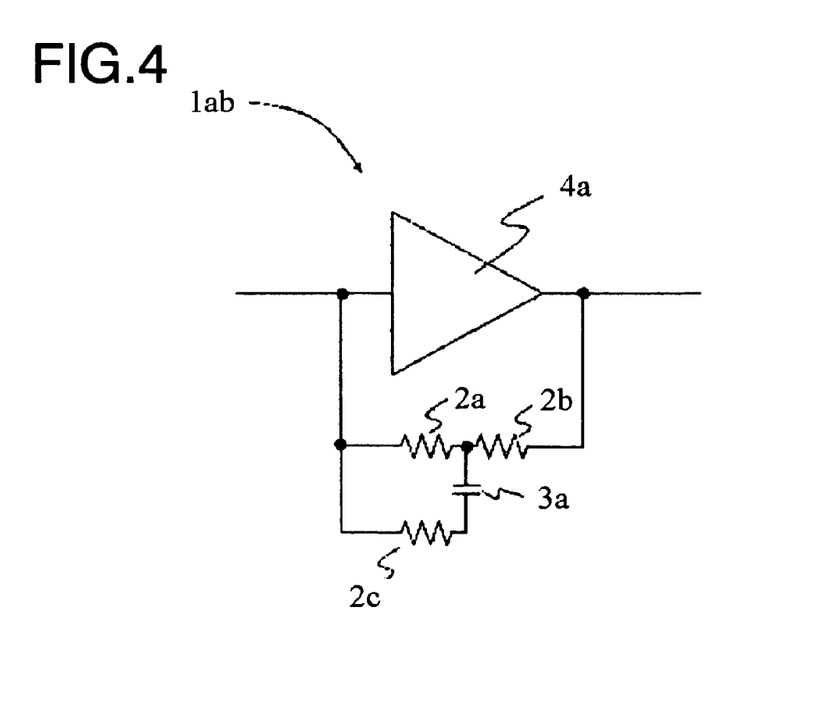
FIG. 4 is a diagram showing a configuration example of a transimpedance amplifier according to a second exemplary embodiment of the present invention.

FIG. 4 is a diagram showing a configuration example of the transimpedance amplifier according to the second exemplary embodiment. That is, in a transimpedance amplifier 1ab according to the second exemplary embodiment, an amplifier 4a and a feedback circuit formed of resistances 2a, 2b, and 2c, and a capacitance 3a are arranged. It means that the feedback circuit in the transimpedance amplifier 1ab according to the second exemplary embodiment is a circuit obtained by removing the resistance 2d from the transimpedance amplifier 1a according to the first exemplary embodiment, to leave open.

An effect of this exemplary embodiment will be further described using expressions.

When resistance values of the resistance 2a, the resistance 2b, and the resistance 2c in the feedback circuit in the transimpedance amplifier 1ab according to the second exemplary embodiment are indicated by R1, R2, and R3, respectively, and when a capacitance value of the capacitance 3a is indicated by C, a transfer impedance of the feedback circuit is given by the following expression (7).

[Math 8]
$$R = \frac{(R_1 + R_2) + j\omega C \{R_1 R_2 + R_2 R_3 + R_3 R_1\}}{1 + j\omega C (R_1 + R_3)} \quad (7)$$

In a low frequency region, a transfer impedance of the feedback circuit is given by the following expression (8), and in a high frequency region, a transfer impedance of the feedback circuit is given by the following expression (9).

$$R_{low} = R_1 + R_2 \quad (8)$$

[Math 10]
$$R = \frac{R_1 R_2 + R_2 R_3 + R_3 R_1}{R_1 + R_3} \quad (9)$$

As shown from the above expression, the transfer impedance becomes constant with respect to frequencies on a high frequency side. Thus, remarkable reduction of a gain on the high frequency side can be suppressed.

Figure 5:
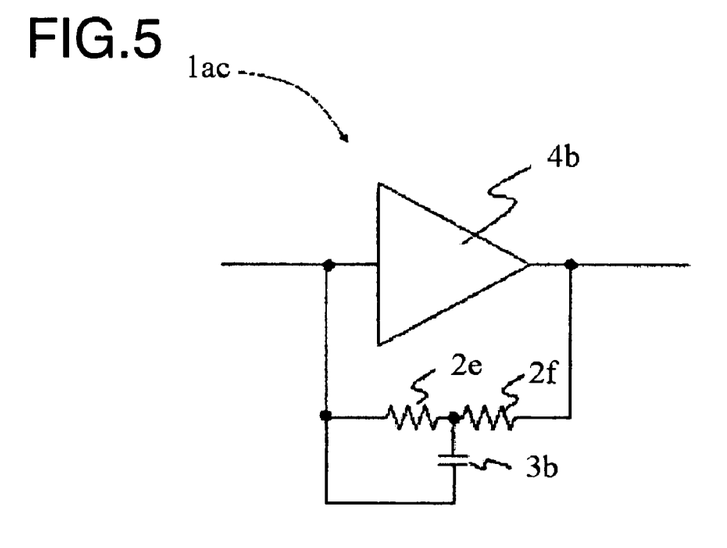
FIG. 5 is a diagram showing a configuration example of the transimpedance amplifier according to the second exemplary embodiment of the present invention.

In this exemplary embodiment, the feedback circuit may be the one in which the resistance 2c in the feedback circuit shown in FIG. 4 is short-circuited as shown in FIG. 5.

A desirable extreme frequency of the feedback circuit in this exemplary embodiment is the one that is identical to a peaking frequency.

Figure 6:
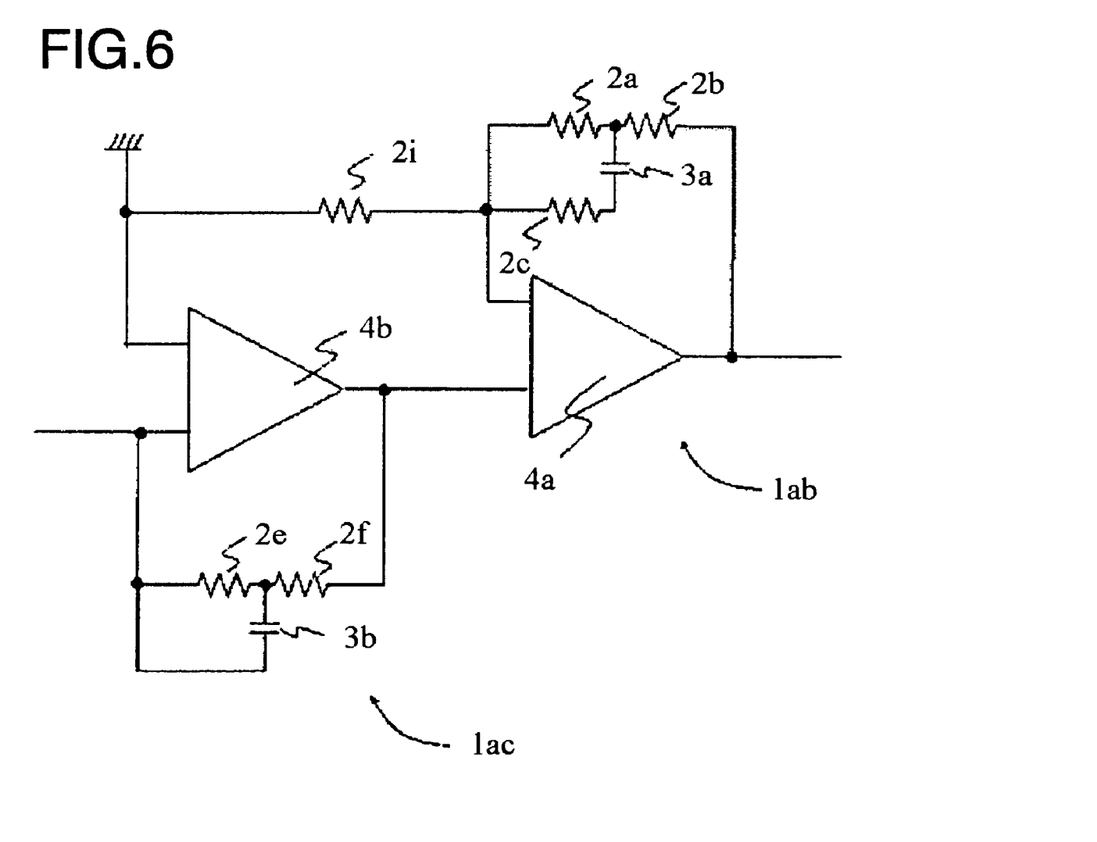
FIG. 6 is a diagram showing a configuration example of the transimpedance amplifier according to the second exemplary embodiment of the present invention.

Further, the transimpedance amplifier in this exemplary embodiment may be formed of a multi-stage configuration, using a plurality of amplifiers (amplifiers) 4a and 4b, as shown in FIG. 6.

Third Exemplary Embodiment

Next, a transimpedance amplifier according to a third exemplary embodiment of the present invention will be described with reference to drawings.

Figure 7:
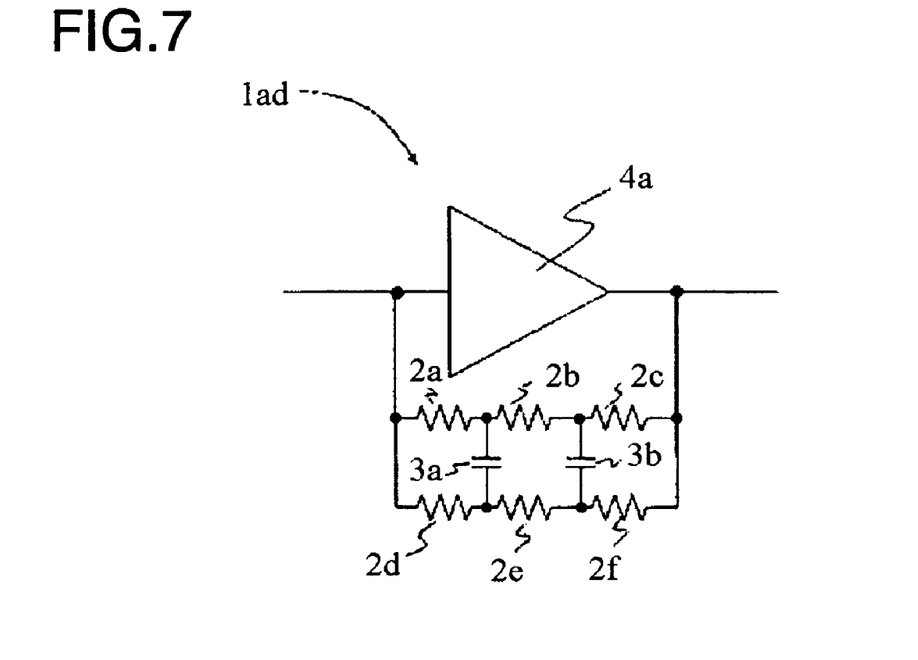
FIG. 7 is a diagram showing a configuration example of a transimpedance amplifier according to a third exemplary embodiment of the present invention.

FIG. 7 is a diagram showing a configuration example of the transimpedance amplifier according to the third exemplary embodiment. That is, in a transimpedance amplifier 1ad according to the third exemplary embodiment, an amplifier 4a and a feedback circuit formed of resistances 2a, 2b, 2c, 2d, 2e, and 2f and capacitances 3a and 3b are arranged. More specifically, the feedback circuit is a two-terminal feedback circuit formed of six resistances (2a, 2b, 2c, 2d, 2e, and 2f) and two capacitances 3a and 3b. The resistances 2a, 2b, and 2c and the resistances 2d, 2e, 2f are connected in parallel, the resistances connected in parallel are divided into three (resistance groups), and each of the capacitances 3a and 3b is connected between respective ones of contacts at which the resistances are divided.

An effect of this exemplary embodiment will be further described using expressions.

When resistance values of the resistance 2a, resistance 2b, resistance 2c, and resistance 2d, resistance 2e, and resistance 2f in the feedback circuit in the transimpedance amplifier lad according to the third exemplary embodiment are indicated by R1, R2, R3, R4, R5, and R6, respectively, a transfer impedance in a low frequency region is given by the following expression (10) and a transfer impedance in a high frequency region is given by the following expression (11).

[Math 11]

$$R_{low} = \frac{(R_1 + R_2 + R_3)(R_4 + R_5 + R_6)}{R_1 + R_2 + R_3 + R_4 + R_5 + R_6} \quad (10)$$

[Math 12]

$$R_{high} = \frac{R_1 R_4 (R_2 + R_5)(R_3 + R_6) + R_2 R_5 (R_3 + R_6)(R_1 + R_4) + R_3 R_6 (R_1 + R_4)(R_2 + R_5)}{(R_1 + R_4)(R_2 + R_5)(R_3 + R_6)} \quad (11)$$

As apparent from the above expression, as in the feedback circuit in the first exemplary embodiment, the transfer impedance becomes constant with respect to frequencies on a high frequency side. Thus, remarkable reduction of a gain on the higher frequency side can be suppressed.

In this exemplary embodiment, preferably, a largest extreme frequency of the feedback circuit is identical to a peaking frequency.

In this exemplary embodiment, preferably, a plurality of extreme frequencies of the feedback circuit are identical to a plurality of peaking frequencies, respectively.

Figure 8:
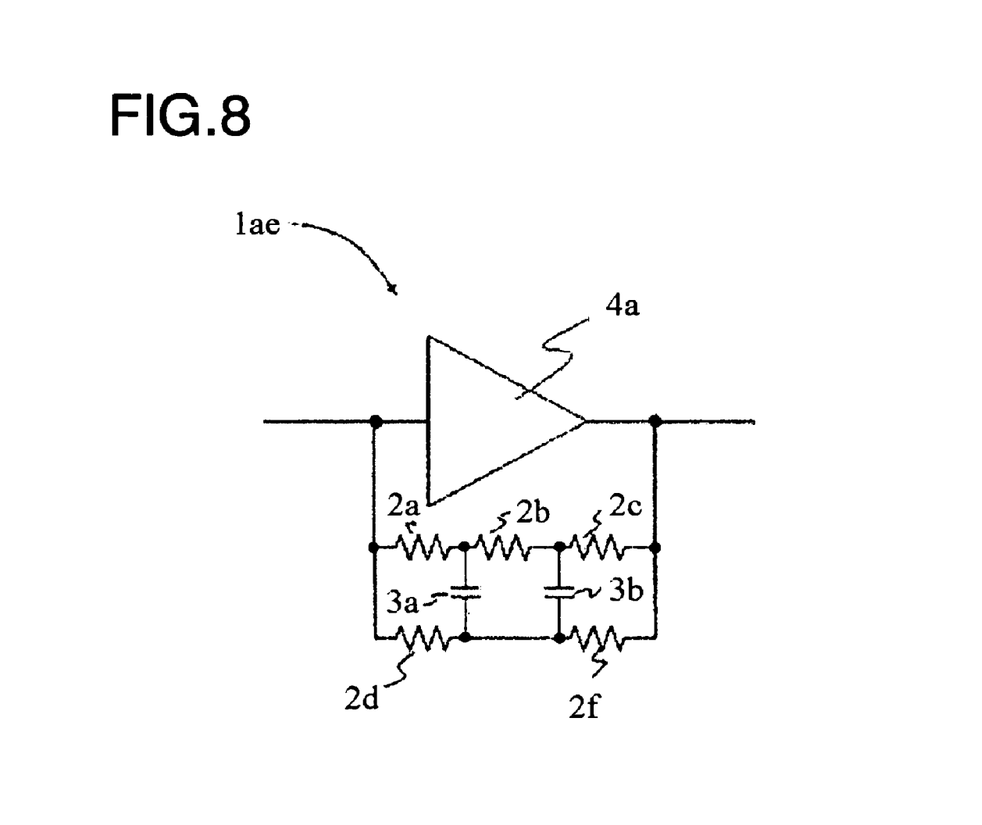
FIG. 8 is a diagram showing a configuration example of the transimpedance amplifier according to the third exemplary embodiment of the present invention.

In this exemplary embodiment, the feedback circuit may be the one in which the resistance 2e in the feedback circuit shown in FIG. 7 is short-circuited, as in a transimpedance amplifier 1ae shown in FIG. 8.

Figure 9:
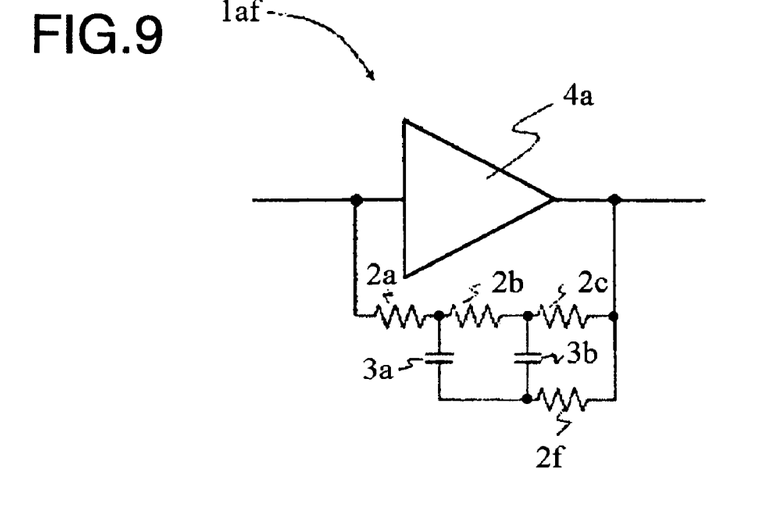
FIG. 9 is a diagram showing a configuration example of the transimpedance amplifier according to the third exemplary embodiment of the present invention.

Alternatively, in this exemplary embodiment, the feedback circuit may be the one in which the resistance 2e in the feedback circuit shown in FIG. 7 is short-circuited, and the resistance 2d is removed, for leaving open, as in a transimpedance amplifier 1af shown in FIG. 9.

The above description was directed to the exemplary embodiments of the present invention. A specific configuration of the present invention, however, is not limited to the first through third exemplary embodiments described above. Even a change in design or the like without departing from the gist of the present invention may be included within the scope of the invention.

The invention claimed is:

1. A transimpedance amplifier comprising:
   a feedback circuit having two or more extreme frequencies, said feedback circuit having a filter characteristic which is flat with respect to frequencies in a frequency region not more than a smallest extreme frequency among the extreme frequencies, is flat with respect to frequencies in a frequency region not less than a largest extreme frequency among the extreme frequencies, and has at least one negative inclination portion with respect to frequencies in a frequency region between the smallest and largest extreme frequencies; and
   an amplifier connected to said feedback circuit;
   the largest extreme frequency of said feedback circuit being identical to a peaking frequency of said amplifier,
   wherein said feedback circuit is the feedback circuit having two terminals, said feedback circuit being formed of a plurality of resistances and at least one capacitance, said resistances being connected in parallel between said two terminals, said resistances being divided into two or more resistance groups, and said at least one capacitance being connected between respective dividing points of said resistances.

2. The transimpedance amplifier according to claim 1, wherein a part of said divided resistances is removed.

3. The transimpedance amplifier according to claim 1, wherein a part of said divided resistances is short-circuited.

4. The transimpedance amplifier according to claim 1, wherein a part of said divided resistances is removed, and a part of said divided resistances is short-circuited.

5. A transimpedance amplifier comprising:
   a feedback circuit having two or more extreme frequencies, said feedback circuit having a filter characteristic which is flat with respect to frequencies in a frequency region not more than a smallest extreme frequency among the extreme frequencies, is flat with respect to frequencies in a frequency region not less than a largest extreme frequency among the extreme frequencies, and has at least one negative inclination portion with respect to frequencies in a frequency region between the smallest and largest extreme frequencies; and
   an amplifier connected to said feedback circuit;
   wherein said amplifier has a plurality of peaking frequencies, and the extreme frequencies of said feedback circuit are identical to the peaking frequencies, respectively,
   wherein said feedback circuit is the feedback circuit having two terminals, said feedback circuit being formed of a plurality of resistances and at least one capacitance, said resistances being connected in parallel between said two terminals, said resistances being divided into two or more resistance groups, and said at least one capacitance being connected between respective dividing points of said resistances.

6. The transimpedance amplifier according to claim 5, wherein a part of said divided resistances is removed.

7. The transimpedance amplifier according to claim 5, wherein a part of said divided resistances is short-circuited.

8. The transimpedance amplifier according to claim 5, wherein a part of said divided resistances is removed, and a part of said divided resistances is short-circuited.

* * * * *